(12) United States Patent
Silva

(10) Patent No.: US 7,189,919 B2
(45) Date of Patent: Mar. 13, 2007

(54) HOUSING FOR ANTENNA AMPLIFIER

(75) Inventor: David Silva, Nürtingen (DE)

(73) Assignee: Hirschmann Electronics GmbH & Co. KG, Neckartenzlingen (DE)

(*) Notice: Subject to any disclaimer, the term of this patent is extended or adjusted under 35 U.S.C. 154(b) by 0 days.

(21) Appl. No.: 10/528,128

(22) PCT Filed: Oct. 10, 2003

(86) PCT No.: PCT/EP03/11260

§ 371 (c)(1),
(2), (4) Date: Mar. 1, 2005

(87) PCT Pub. No.: WO2004/036970

PCT Pub. Date: Apr. 29, 2004

(65) Prior Publication Data

US 2005/0247473 A1    Nov. 10, 2005

(30) Foreign Application Priority Data

Oct. 11, 2002   (DE) ................. 102 47 631

(51) Int. Cl.
*H02G 3/08* (2006.01)
*H05K 5/00* (2006.01)

(52) U.S. Cl. ............. 174/50; 174/17 R; 174/521; 439/76.1; 439/76.2; 220/3.2

(58) Field of Classification Search ............ 174/50, 174/53, 58, 17 R, 52.1, 57, 59, 520; 220/3.2, 220/3.3, 3.4, 3.5, 3.6, 3.7, 3.8, 3.9, 4.02; 439/535, 536, 537, 538, 76.1, 6.2, 949, 622; 361/600, 601, 679
See application file for complete search history.

(56) References Cited

U.S. PATENT DOCUMENTS 5,373,104 A * 12/1994 Brauer .................. 174/52.1
5,536,917 A    7/1996 Suppelsa et al.
5,684,274 A   11/1997 McLeod
5,718,598 A *  2/1998 Saka et al. ............... 439/949
6,121,548 A *  9/2000 Matsuoka ................. 174/59
6,126,458 A * 10/2000 Gregory et al. ......... 439/76.2
6,444,904 B1   9/2002 Holman, IV et al.
6,570,088 B1 * 5/2003 Depp et al. ............... 174/50
6,815,612 B2 * 11/2004 Bloodworth et al. ...... 174/50
6,848,946 B2 * 2/2005 Vicenza et al. ........... 439/622

FOREIGN PATENT DOCUMENTS

| EP | 0 491 270 | 6/1992 |
| EP | 1 221 689 | 7/2002 |
| FR | 2 614 169 | 10/1988 |

* cited by examiner

*Primary Examiner*—Angel R. Estrada
(74) *Attorney, Agent, or Firm*—Andrew Wilford

(57) ABSTRACT

A housing for an electronic device in automotive technology has two molded-plastic housing parts fittable together to form a cavity and a membrane hinge unitarily formed with the parts and permitting relative pivoting of the parts between an open position and a closed position. The electronic device is secured in the cavity between the parts. Respective snap formations on the parts are fittable together only in the closed position in a condition of one of the parts bearing with prestress on the other part for securing the parts together against separation. One of the snap formations is elastically deformable transversely of an opening direction into and out of latching engagement with the other of the formations.

5 Claims, 2 Drawing Sheets

HOUSING FOR ANTENNA AMPLIFIER

CROSS REFERENCE TO RELATED APPLICATIONS

This application is the U.S. national phase of PCT application PCT/EP2003/011260 filed 10 Oct. 2003 with a claim to the priority of German patent application 10247631.4 itself filed 11 Oct. 2002.

FIELD OF THE INVENTION

The invention relates to a housing, especially of plastic for an electronic circuit, especially an antenna amplifier for use in vehicle automotive technology and having at least two housing parts of plastic that can be locked together with at least one snap connection.

BACKGROUND OF THE INVENTION

Electronic circuits which include electronic components arranged on a printed circuit board are usually protected by a housing of plastic for better isolation from mechanical effects outside. In order to be able to arrange the printed circuit board in the housing, the housing can be comprised of two identical or different halves although more than two parts can be conceivable as well. After the mounting of the printed circuit board in one of the housing parts, at least a further housing part can be connected detachably or nondetachably therewith. If the connection is a nondetachable connection, the housing parts can be Joined, for example, by an adhesive. This has however the disadvantage that in the case of failure, the housing must be destroyed to afford access to the mounted circuit board and its components.

A screw connection of the two housing parts, for example, is conceivable for a detachable connection thereof. This however has the drawback that, to connect the two housing parts, a tool as well as additional fasteners are required. This increases the number of parts which are necessary and, in conjunction therewith, the cost of mounting or assembly. In addition, snap connections are known for connecting the housing parts together and can include detent hooks on one housing part which can engage in openings or recesses in the other housing part. These can have however the disadvantage that they may not be able to connect the two housing parts sufficiently strongly together so that, in spite of the connection of the housing part by snap fasteners, the two housing parts can move relative to one another and can lead to undesired noise generated by the relative movement of the housing parts. Furthermore, the reliability of any seal between the two housing parts cannot be guaranteed so that especially it is possible for moisture or water sprayed onto the housing to penetrate into the interior. There is also the danger with such snap connections that two parts will not sufficiently lock together or will not lock together at all so that while optically one might have the impression that the two housing parts are connected together in operation and especially in the case of vibration, the two housing parts can become detached from one another.

OBJECT OF THE INVENTION

It is the object of the invention, therefore, to provide a housing of at least two parts to receive a printed circuit board with electronic components thereon, especially an antenna amplifier for an automotive vehicle in which the at least two housing parts are connected together by a snap connection more reliably and effectively.

SUMMARY OF THE INVENTION

This object is achieved in that at least one snap connection is so configured that after the parts are locked together, they remain under a prestress, for which purpose on the one housing part an elastically yieldable snap formation is arranged and on at least a further housing part, there is a part which effectively cooperates with that snap formation to provide the elastic connection. The elastically yieldable snap formation is so formed that it, after the assembly of the at least two parts, first forms a connection with the corresponding parts when a mechanical effect, especially a pressure application has been applied or produced. These snap connections for joining the at least two housing parts together have the advantage that they can be mounted or connected without additional components in that they are namely provided on the at least two housing parts and assembled by pressing the snap formation. The snap formation then engages forceably or indexes with the corresponding part of the other housing part and connects the two housing parts reliably and effectively together.

Through the pressure application to the snap formation, the entire snap connection after assembly remains under a certain prestress so that the at least two housing parts reliably bear against one another and can no longer move relative to one another.

A further advantage of the invention resides in that, after pressure applications to the snap formation on the one housing part during its engagement with the corresponding part, a sound (click) can be heard which serves as a signal to the mounting individual that the snap connection has been engaged in a reliable and proper manner. The same applies also for automated assembly of the at least two housing halves. The prestress under which the at least two housing parts remain has, in addition, the advantage that it can survive permanently harsh environmental conditions as may prevail in an automotive vehicle releasably without the development of noise from relative movement of the at least two housing parts. It is still another advantage of the snap connection according to the invention that the at least two housing parts can be separated from one another by release of the snap connection to enable replacement of the electronic device found in the housing, for example in the case of a defect.

BRIEF DESCRIPTION OF THE DRAWING

An embodiment of the housing according to the invention which, however, should not be considered limiting of the invention is described in the following with reference to the Figures. They show.

SPECIFIC DESCRIPTION

Figure 1:
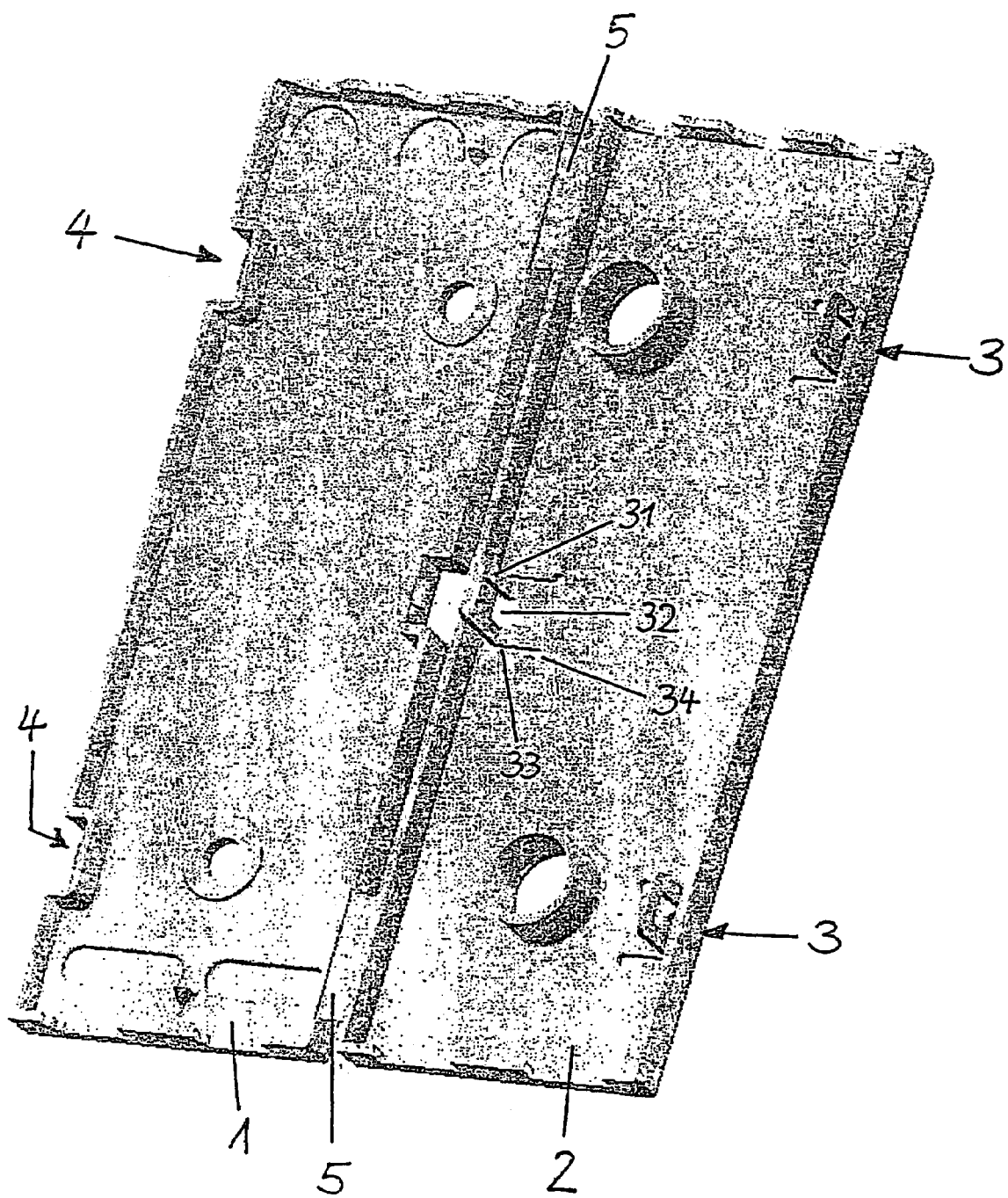
FIG. 1 two housing parts from the interior.

FIG. 1 shows by way of example and in perspective view two housing parts 1 and 2, the invention being applicable independently of the geometric dimension of the housing parts 1 and 2. Not shown in FIG. 1 is the electronic device which can be enclosed by the two housing parts 1 and 2, and which can be for example an antenna amplifier, a video module or the like for transmission and reception of signals received from a vehicle or supplied to a vehicle. The preferred application of the housing of the invention is in vehicles since here harsh environmental conditions like temperature fluctuations, vibrations and the like prevail so that in this preferred field of use it is especially important that the two housing parts 1 and 2 (or more than two) be able to be connected together permanently and reliably. For this purpose snap formations 3 are provided in one or a greater number on one of the housing parts, here in FIG. 1 on the housing part 2. In the illustrated embodiment, the snap formation 3 on the housing parts 2 is a lug 31 with a window or opening 32, the lug 31 being anchored outwardly in this embodiment. Angular inclination is made possible by slits 33 which support the lug 31 from the housing part 2 and ensure that the lug is only connected at an end region with the housing part 2. Such a lug 31 is thus movably arranged on the housing part 2 and at the end of each slit 33 a widening 34 can be provided to avoid having the lug 31 tear off the housing part 2 upon movement of that lug. As a part corresponding to the snap formation 3 of housing 2, there is a corresponding snap formation 4 provided on the housing 1 for engagement with each snap formation 3 of the housing 2. The two snap formations 3 and 4 form a snap connection so that the snap formation 3 should be engageable with the snap formation 4 to cooperate therewith. In an especially advantageous manner, each snap formation 4 can be a region 41 set back from the surface of the housing part and, in this set back region 41, a detent hook 42 can be provided which can engage in the recess or window 32 of the angled lug.

The housing parts shown in FIG. 1 can be either separate from one another or fabricated together or in one piece, in which case it is especially advantageous to provide a membrane or film hinge 5 between the two housing parts 1 and 2 as a general connector. The film hinge 5 has the advantage that the two housing parts 1 and 2 need then only be provided with the electronic unit (especially the circuit board with its electronic components and plug connectors or contacts) and then the two parts can be swung together and fastened with engagement of the snap formations 3 and 4. This can be achieved very simply and very quickly manually or in an automated manner. It is also conceivable that for example along the longitudinal edges of the two housing parts 1 and 2, a seal can be provided. The same applies to guide elements (like for example pins and corresponding bores or the like) which on the one hand enable positioning of the electronic device in one of the two housing parts 1 and 2 and the positioning and fastening of the two housing parts 1 and 2 to one another. Such guide elements are especially required when the two housing parts 1 and 2 are not connected together by the connecting means (like for example the film hinge 5).

In an especially advantageous way, the at least two housing parts 1 and 2 can be made in an injection molding process for synthetic resins or plastics which can produce, by a corresponding shaping of the mold, all of the structural configurations of the two housing parts 1 and 2 in a single fabrication step. This applies especially to the snap formations 3 and 4 which are provided on manufacture of the two housing parts. This eliminates the need for machining operations in an especially advantageous way.

Figure 2:
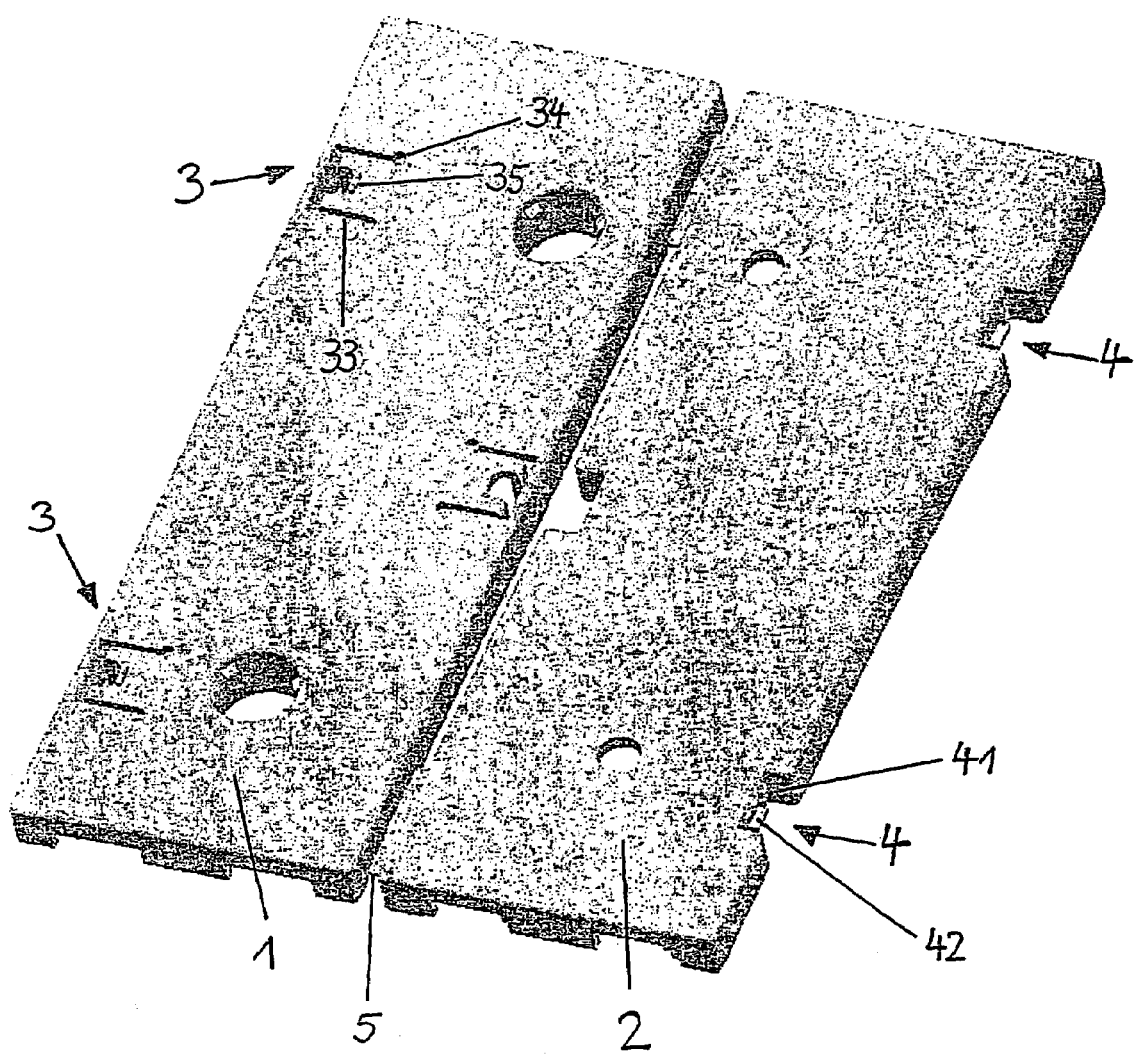
FIG. 2 two housing parts from the exterior.

FIG. 2 shows a plan view of the two housing parts form which the corresponding positions of the snap formations 3 and 4 can be seen in an especially advantageous way. Attention should be directed to the following important details:

The snap formation 3 for example on the housing part 2 need not be located in a setback region 41. Within this setback region, a detent hook 42 can be provided which can engage in the recess 32 of the angled lug 31. By a corresponding shape of the lug 31 and its arrangement within the housing part 1, especially because of the slits 33, the lug 31 can be deflected out of the plane of the surface of the housing part 1. The dimensions and the positions of the lugs with respect to the detent hooks 42 are such that upon closure of the two housing parts 1 and 2 about the film hinge 5 (or other assembly techniques) there is no immediate engagement of the lug 31 with the respective detent hook 42.

This engagement or locking is in an especially advantageous way first brought about by mechanical application of pressure to the lug 31 for which purpose a projection 35 is provided. The lug 31 is thus pressed over the detent hook 42 and can snap onto the latter, i.e. lock with it. As a result the snap connection remains under prestress and stresses the two housing parts 1 and 2 against one another. To simplify the application of pressure to the lugs 31, the projections 35 are provided by means of which the lugs 31 can be pressed by hand (thumb or index finger) or with a tool, possibly in an automated process. Of special advantage is the prestress which is obtained by snap connection according to the invention especially with the lug 31 and the detent hook 42.

The invention claimed is:

1. A housing for an electronic device in automotive technology, the housing comprising:

two molded-plastic housing parts fittable together to form a cavity;

a membrane hinge unitarily formed with the parts and permitting relative pivoting of the parts between an open position and a closed position;

means for securing the device in the cavity between the parts;

means including respective snap formations on the parts fittable together only in the closed position in a condition of one of the parts bearing with prestress on the other part for securing the parts together against separation, one of the snap formations being elastically deformable transversely of an opening direction into and out of latching engagement with the other of the snap formations.

2. The housing according to claim 1 characterized in that the one snap formation is a lug with a recess or cutout and the other snap formation is a detent hook.

3. The housing according to claim 2 characterized in that the lug is connected only at an end region with the respective housing part and is otherwise separated from the respective housing part by slits.

4. The housing according to claim characterized in that the lug has an outwardly directed projection.

5. The housing according to claim 3 characterized in that the detent hook is located in a region set back with respect to a surface of the respective housing part.

* * * * *